United States Patent
Ko et al.

(10) Patent No.: US 10,340,325 B2
(45) Date of Patent: Jul. 2, 2019

(54) FLEXIBLE DISPLAY HAVING A HIGH STRAIN RATE

(71) Applicant: Samsung Display Co., Ltd., Yongin-si, Gyeonggi-do (KR)

(72) Inventors: Un Byoll Ko, Yeoju-si (KR); Byeong Hwa Choi, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/266,939

(22) Filed: Sep. 15, 2016

(65) Prior Publication Data

US 2017/0110531 A1     Apr. 20, 2017

(30) Foreign Application Priority Data

Oct. 16, 2015 (KR) .......................... 10-2015-0144787

(51) Int. Cl.
| | | |
|---|---|---|
| *H01L 27/32* | (2006.01) | |
| *H01L 51/52* | (2006.01) | |
| *H01L 51/00* | (2006.01) | |

(52) U.S. Cl.
CPC ...... *H01L 27/3276* (2013.01); *H01L 27/3267* (2013.01); *H01L 51/0097* (2013.01); *H01L 51/5203* (2013.01); *H01L 2251/5338* (2013.01); *Y02E 10/549* (2013.01)

(58) Field of Classification Search
CPC ............ H01L 27/3276; H01L 51/5203; H01L 51/0097; H01L 27/3267; H01L 2251/5338; Y02E 10/549
See application file for complete search history.

(56) References Cited

U.S. PATENT DOCUMENTS

| | | | |
|---|---|---|---|
| 8,389,862 B2 | 3/2013 | Arora et al. | |
| 2008/0218369 A1* | 9/2008 | Krans | A47G 9/1045 340/691.1 |
| 2012/0140464 A1* | 6/2012 | Huang | F21V 5/002 362/235 |
| 2013/0044487 A1* | 2/2013 | Burrows | F21V 14/02 362/249.08 |
| 2016/0111485 A1* | 4/2016 | Chida | H01L 27/322 257/40 |

FOREIGN PATENT DOCUMENTS

| | | |
|---|---|---|
| JP | 2008-542834 A | 11/2008 |
| KR | 10-1049240 B1 | 7/2011 |
| KR | 10-2014-0099128 A | 8/2014 |
| WO | WO 2006/129232 A2 | 12/2006 |

* cited by examiner

*Primary Examiner* — Caridad Everhart
(74) *Attorney, Agent, or Firm* — F. Chau & Associates, LLC

(57) ABSTRACT

A flexible display is disclosed. In one aspect, the flexible display includes a substrate and a plurality of first display layers formed on an upper surface of the substrate. The substrate includes a plurality of upper grooves, each of which defines a first opening in the upper surface and a plurality of lower grooves, each of which defines a second opening in a lower surface of the substrate. The upper grooves and the lower grooves are alternately arranged.

20 Claims, 9 Drawing Sheets

FLEXIBLE DISPLAY HAVING A HIGH STRAIN RATE

CROSS-REFERENCE TO RELATED APPLICATION

This application claims priority to and the benefit of Korean Patent Application No. 10-2015-0144787 filed in the Korean Intellectual Property Office on Oct. 16, 2015, the entire contents of which are incorporated herein by reference.

BACKGROUND

Field

The present disclosure relates to a display device.

Description of the Related Technology

Display devices can be divided into a number of categories based on their display technology, including liquid crystal displays (LCDs), plasma display panels (PDPs), organic light-emitting diode (OLED) displays, field emission displays (FEDs), electrophoretic displays (EPDs), etc.

The number of applications in which these display devices can be employed has increased due to the development of flexible displays that can be easily bent. Additionally, stretchable displays are one example of flexible displays which can have their shape or appearance manipulated. However, since stretchable displays are manufactured with a substrate formed of a stretchable material, the manufacturing of these displays is complex compared to standard non-flexible displays and the ways in which the shape of the displays can be manipulated is restricted based on the particular manufacturing process employed. Accordingly, the manufacture of stretchable displays having a high strain rate has remained difficult.

The above information disclosed in this Background section is only intended to facilitate the understanding of the background of the disclosure and therefore it may contain information that does not form the prior art that is already known in this country to a person of ordinary skill in the art.

SUMMARY OF CERTAIN INVENTIVE ASPECTS

One inventive aspect is a display device having a high strain rate and that can be easily manufactured.

Another aspect is a display device including a substrate, and a plurality of first display layers formed on an upper surface of the substrate, wherein the substrate includes a plurality of upper grooves having a first opening in the upper surface and a plurality of lower grooves having a second opening in a lower surface of the substrate, and the upper grooves and the lower grooves are alternately arranged.

The depth of the upper groove can be greater than the width of the upper groove, and the depth of the lower groove can be greater than the width of the lower groove.

The plurality of the upper grooves can include a first upper groove extended in a first direction and a second upper groove extended in a second direction crossing the first direction.

The first upper groove and the second upper groove can be connected to each other.

The plurality of the lower grooves can include a first lower groove extended in a first direction and a second lower groove extended in a second direction crossing the first direction.

The first lower groove and the second lower groove can be connected to each other.

An upper driving wire positioned inside the substrate and extending along the upper surface and the upper groove can be further included, and the upper driving wire can be electrically connected to the first display layer.

The upper driving wire can include a first upper driving wire extending in the first direction and a second upper driving wire extending in the second direction.

The first upper driving wire can include a first upper transverse wire extending in the first direction along the upper surface and a first upper longitudinal wire extending in a depth direction of the upper groove, and the second upper driving wire can include a second upper transverse wire extending along the upper surface in the second direction and a second upper longitudinal wire extending along the depth direction of the upper groove.

A plurality of second display layers positioned on the lower surface can be further included.

A lower driving wire positioned inside the substrate and extending along the lower surface and the lower groove can be further included, and the lower driving wire can be electrically connected to the second display layer.

The lower driving wire can include a first lower driving wire extending in the first direction and a second lower driving wire extending in the second direction.

The first lower driving wire can include a first lower transverse wire extending along the lower surface in the first direction and a first lower longitudinal wire extending along the depth direction of the lower grooves, and the second lower driving wire can include a second lower transverse wire extending along the lower surface in the second direction and a second lower longitudinal wire extending along the depth direction of the lower groove.

Another aspect is a display device comprising a substrate; and a plurality of first display layers formed on an upper surface of the substrate, wherein the substrate includes a plurality of upper grooves, each of which defines a first opening in the upper surface and a plurality of lower grooves, each of which defines a second opening in a lower surface of the substrate, and wherein the upper grooves and the lower grooves are alternately arranged.

In exemplary embodiments, the depth of each of the upper grooves is greater than the width of each of the upper grooves; and the depth of each of the lower grooves is greater than the width of each of the lower grooves. The upper grooves can include a plurality of first upper grooves extending in a first direction and a plurality of second upper grooves extending in a second direction crossing the first direction. The first upper grooves and the second upper grooves can be connected to each other.

In exemplary embodiments, the lower grooves include a plurality of first lower grooves extending in a first direction and a plurality of second lower grooves extending in a second direction crossing the first direction. The first lower grooves and the second lower grooves can be connected to each other. The display device can further comprise a plurality of upper driving wires positioned inside the substrate and extending along the upper surface and the upper grooves, wherein the upper driving wires are electrically connected to the first display layers. The upper driving wires can include a plurality of first upper driving wires extending in the first direction and a plurality of second upper driving wires extending in the second direction.

In exemplary embodiments, each of the first upper driving wires includes a first upper transverse wire extending in the first direction along the upper surface; and a first upper longitudinal wire extending in a depth direction of the upper groove, and wherein each of the second upper driving wires includes: a second upper transverse wire extending along the upper surface in the second direction; and a second upper longitudinal wire extending along the depth direction of the upper groove. The display device can further comprise a plurality of second display layers positioned on the lower surface of the substrate.

In exemplary embodiments, the display device further comprises a plurality of lower driving wires positioned inside the substrate and extending along the lower surface and the lower groove, wherein the lower driving wires are electrically connected to the second display layers. The lower driving wires can include a plurality of first lower driving wires extending in the first direction and a plurality of second lower driving wires extending in the second direction.

In exemplary embodiments, each of the first lower driving wires includes: a first lower transverse wire extending along the lower surface in the first direction; and a first lower longitudinal wire extending along the depth direction of the lower grooves, and wherein each of the second lower driving wires includes: a second lower transverse wire extending along the lower surface in the second direction; and a second lower longitudinal wire extending along the depth direction of the lower groove.

According to at least one embodiment of the present disclosure, a strain rate of the display device can be improved through the inclusion of a substrate formed of a material having low stretchability.

Further, although the substrate is stretched, the deterioration of the resolution can be reduced.

DETAILED DESCRIPTION OF CERTAIN INVENTIVE EMBODIMENTS

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

In addition, unless explicitly described to the contrary, the word "comprise" and variations such as "comprises" or "comprising" will be understood to imply the inclusion of stated elements but not the exclusion of any other elements. Further, throughout the present specification, it will be understood that when an element such as a layer, film, region, or substrate is referred to as being "on" another element, it can be directly on the other element or intervening elements may also be present. Further, in the specification, the word "on" or "over" generally refers to the positioning on or below an object portion, but is not restricted to positioning on the upper side of the object portion based on the orientation of the object portion with respect to the direction of gravity.

Now, the display device according to an exemplary embodiment of the present disclosure will be described with reference to FIGS. 1 and 2.

Figure 1:
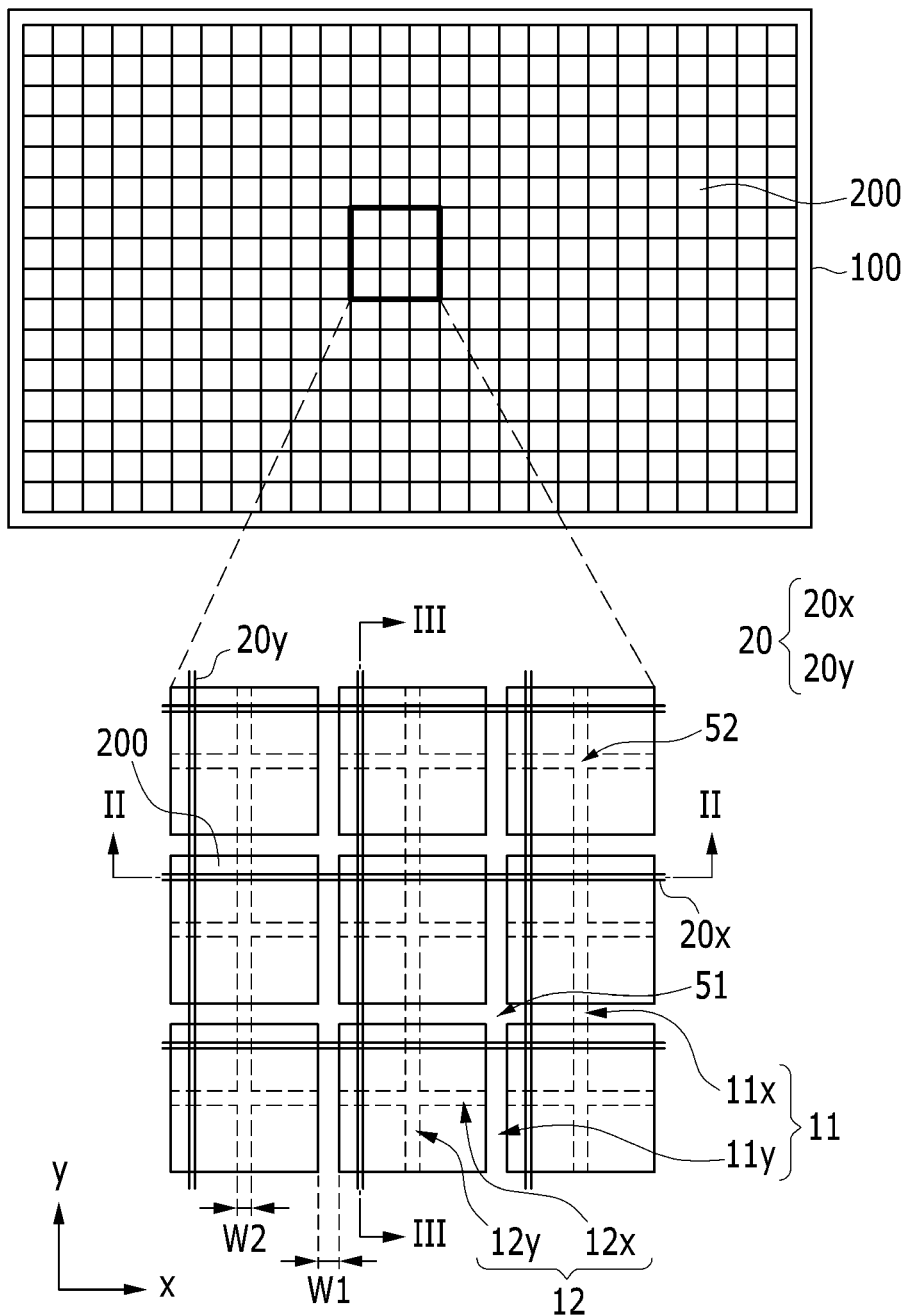
FIG. 1 is a top plan view of a display device according to an exemplary embodiment of the present disclosure.

FIG. 1 is a top plan view of a display device according to an exemplary embodiment of the present disclosure. FIG. 2 is a cross-sectional view taken along line II-II of FIG. 1. 3 is a cross-sectional view taken along line III-III of FIG. 1.

Figure 2:
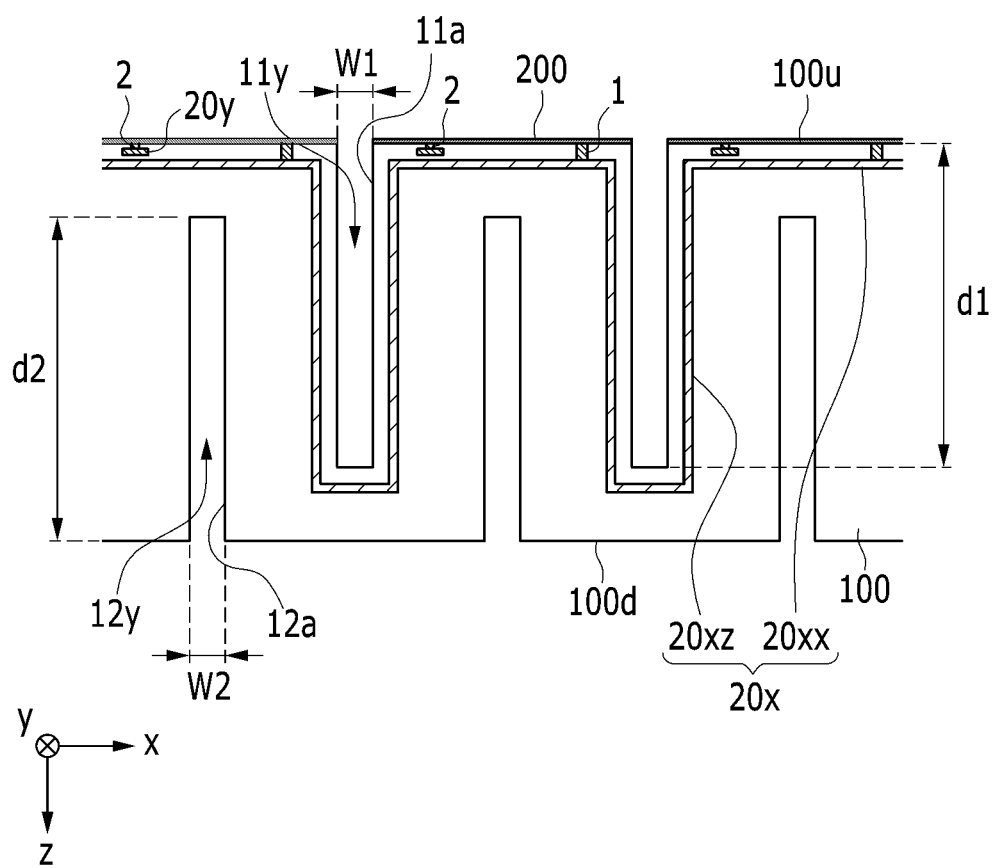
FIG. 2 is a cross-sectional view taken along line II-II of FIG. 1.
Figure 3:
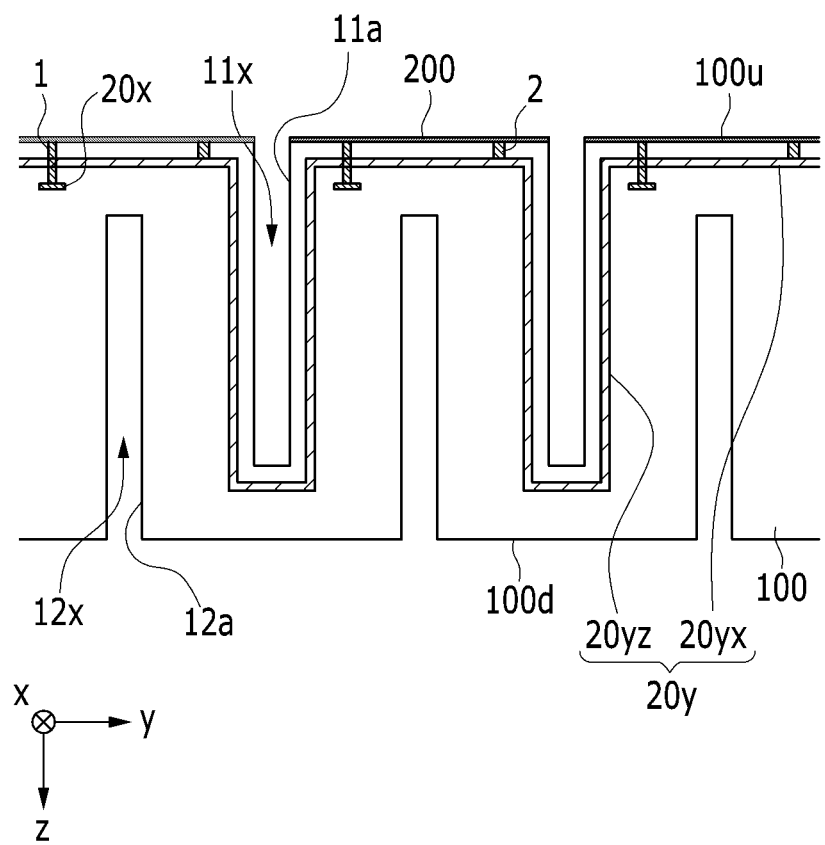
FIG. 3 is a cross-sectional view taken along line III-III of FIG. 1.

As shown in FIGS. 1, 2, and 3, a display device according to an exemplary embodiment of the present disclosure includes a substrate 100 and a plurality of first display layers 200 positioned on an upper surface 100u of the substrate 100. In FIG. 1, the first display layer 200 is shown with a rectangular shape, however it is not limited thereto, and various shapes are possible.

The substrate 100 can be formed of a flexible material such as a polyimide. The substrate 100 includes a plurality of upper grooves 11 having a first opening 11a on the upper surface 100u and a plurality of lower grooves 12 having a second opening 12a on the lower surface 100d of the substrate 100. The upper grooves 11 and the lower grooves 12 are alternately positioned or alternately arranged.

The upper grooves 11 include a first upper groove 11x extending in the first direction x and a second upper groove 11y extending in a second direction y crossing the first direction x. The first upper groove 11x and the second upper groove 11y are connected to each other at a first crossing region 51. The first upper groove 11x and the second upper groove 11y form a lattice.

The lower grooves 12 include a first lower groove 12x extending in the first direction X and a second lower groove 12y extending in the second direction y crossing the first direction x. The first lower groove 12x and the second lower groove 12y are connected to each other at a second crossing region 52. The first lower groove 12x and the second lower groove 12y form a lattice.

The depth d1 of the upper grooves 11 can be greater than the width W1 of the upper grooves 11. Similarly, the depth d2 of the lower grooves 12 can be greater than the width W2 of the lower grooves 12. As the depth d1 of the upper grooves 11 can be greater than the width W1 of the upper grooves 11, the substrate 100 can be easily transformed or extended in one or more of the first direction x and the second direction y, each of which extends in a lateral direction of the substrate 100. Also, as the depth d2 of the lower grooves 12 can be greater than the width W2 of the lower grooves 12, the substrate 100 can be easily transformed or extended in the lateral direction(s) of the substrate 100.

The first display layer 200 can include a light-emitting structure such as an organic light-emitting diode (OLED), a polymer light-emitting diode (PLED), a quantum dot (QD), and a light-emitting diode (LED).

Figure 4:
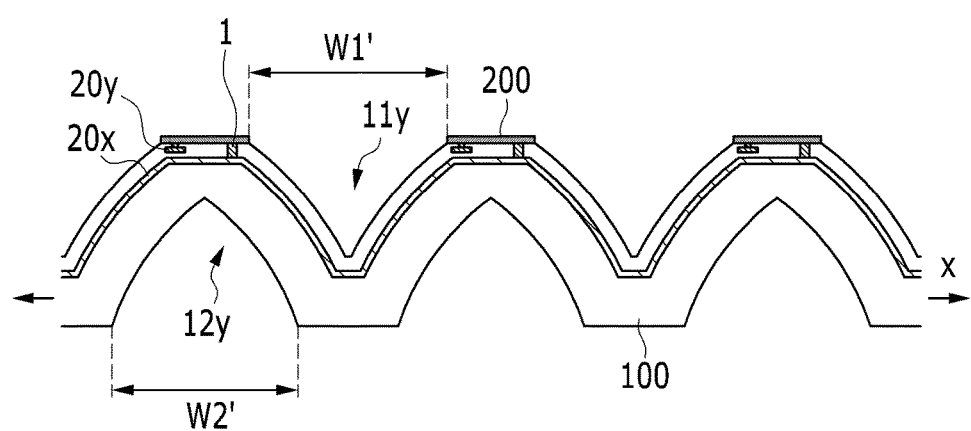
FIG. 4 is a cross-sectional view showing the display device of FIG. 2 stretched in a first direction x.

FIG. 4 is a cross-sectional view showing the display device of FIG. 2 stretched in a first direction x.

As shown in FIG. 4, since the second upper groove 11y and the second lower groove 12y extending in the second direction y are alternately positioned, stress generated within the substrate 100 when stretched is decreased and the substrate 100 can be easily stretched in the first direction x. Accordingly, the width W1' of the second upper groove 11y when the substrate 100 is in a stretched configuration is greater than the width W1 of the second upper groove 11y prior to stretching. Further, the width W2' of the second lower groove 12y when the substrate 100 is in a stretched configuration is greater than the width W2 of the second lower groove 12y prior to stretching. As described above, although the substrate 100 is not formed of a stretchable material, the substrate 100 can be easily stretched in the first direction x. Accordingly, the distance between the first display layers 200 positioned adjacent to the upper surface 100u of the substrate 100 in the first direction x increases, so the display device can be used as a stretchable display device.

Also, since the first upper groove 11x and the first lower groove 12x extending in the first direction x are alternately positioned, the inner stress of the substrate 100 is reduced such that the substrate 100 can be easily stretched in the second direction y. Accordingly, the width of the first upper groove 11x and the width of the first lower groove 12x increase when stretched. As described above, even though the substrate 100 is not formed of the stretchable material, the substrate 100 can be easily stretched in the second direction y. Accordingly, the distance between the first display layers 200 positioned adjacent to the upper surface 100u of the substrate 100 in the second direction y is increased, so the display device can be used as a stretchable display device.

An upper driving wire 20 electrically connected to the first display layer 200 is positioned at the upper side inside the substrate 100. The upper driving wire 20 includes a first upper driving wire 20x extending in the first direction x and a second upper driving wire 20y extending the second direction y crossing the first direction x. The first upper driving wire 20x is connected to the first display layer 200 through a first connection wire 1, and the second upper driving wire 20y is connected to the first display layer 200 through a second connection wire 2.

The first upper driving wire 20x includes a first upper transverse wire 20xx extending along the upper surface 100u of the substrate 100 and a first upper longitudinal wire 20xz extending along a depth direction Z of the upper grooves 11. As described above, since the first upper driving wire 20x is not only formed along the upper surface 100u of the substrate 100, but is also formed along the upper grooves 11 of the substrate 100, when the substrate 100 is stretched in the first direction X, the first upper driving wire 20x is not damaged but can be maintained.

The second upper driving wire 20y includes a second upper transverse wire 20yx extending along the upper surface 100u of the substrate 100 and a second upper longitudinal wire 20yz extending along the depth direction Z of the upper grooves 11. As described above, since the second upper driving wire 20y is not only formed along the upper surface 100u of the substrate 100, but is also formed along the upper grooves 11 of the substrate 100, when the substrate 100 is stretched in the second direction Y, the second upper driving wire 20y is not damaged, but can be maintained.

The upper driving wire 20 can be formed of a metal having excellent conductivity such as gold (Au), silver (Ag), molybdenum (Mo), aluminum (Al), copper (Cu), or a nanomaterial having excellent flexibility and conductivity such as a nanowire, a carbon nanotube (CNT), and graphene.

In this way, even though the substrate 100 is not formed of a stretchable material, as the upper grooves 11 and lower grooves 12 are alternately positioned on the substrate 100, the substrate 100 can be easily stretched such that the strain rate of the substrate 100 is increased compared to the standard non-flexible display.

Next, a detailed structure of the first display layer 200 will be described with reference to FIGS. 3, 5, 6, and 7.

Figure 5:
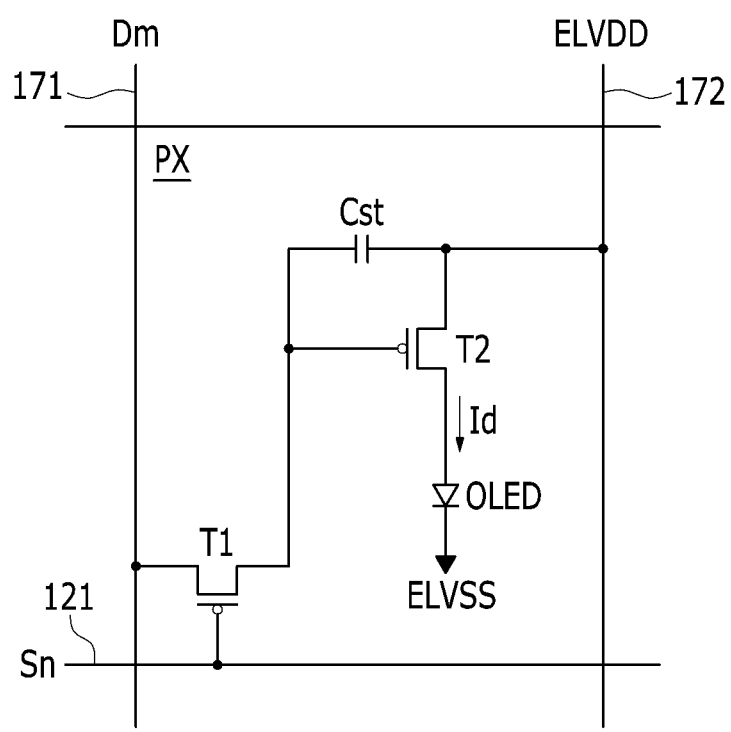
FIG. 5 is an equivalent circuit of a first display layer of a display device according to an exemplary embodiment of the present disclosure.

FIG. 5 is an equivalent circuit of a first display layer of a display device according to an exemplary embodiment of the present disclosure.

As shown in FIGS. 3 and 5, one pixel PX formed in the first display layer 200 of the display device according to an exemplary embodiment of the present disclosure includes a plurality of signal lines 121, 171, and 172, a plurality of transistors T1 and T2 connected to the signal lines, a storage capacitor Cst, and an OLED.

The transistors T1 and T2 include a switching transistor T1 and a driving transistor T2.

The signal lines 121, 171, and 172 include a plurality of scan lines 121 transmitting scan signals Sn, a plurality of data lines 171 crossing the scan lines 121 and transmitting data signals Dm, and a plurality of driving voltage lines 172 transmitting a driving voltage ELVDD and being arranged substantially parallel to the data lines 171.

The switching transistor T1 has a control terminal, an input terminal, and an output terminal. The control terminal of the switching transistor T1 is connected to the scan line 121, the input terminal is connected to the data line 171, and the output terminal is connected to the driving transistor T2. The switching transistor T1 transmits the data signal Dm applied to the data line 171 to the driving transistor T2 in response to the scan signal Sn applied to the scan line 121.

The driving transistor T2 also has a control terminal, an input terminal, and an output terminal. The control terminal of the driving transistor T2 is connected to the switching transistor T1, the input terminal is connected to the driving voltage line 172, and the output terminal is connected to the OLED. The driving transistor T2 applies a driving current Id having a magnitude that varies in accordance with the voltage between the control terminal and the output terminal of the driving transistor T2.

The storage capacitor Cst is connected between the control terminal and the input terminal of the driving transistor T2. The storage capacitor Cst stores an amount of charge corresponding to the data signal applied to the control terminal of the driving transistor T2 and maintains the amount of charge after the switching transistor T1 is turned off.

The OLED has an anode connected to the output terminal of the driving transistor T2 and a cathode connected to the common voltage ELVSS. The OLED emits light by changing its intensity depending on the driving current Id, thereby displaying an image.

The switching transistor T1 and the driving transistor T2 can be n-channel electric field effect transistors (FETs) or p-channel electric FETs. Also, the connection relationship between the transistors T1 and T2, the storage capacitor Cst, and the OLED can be changed depending on the particular implementation of the pixel PX.

Next, the detailed structure of the pixel of the first display layer shown in FIG. 5 will be described with reference to FIGS. 6 and 7 as well as FIG. 5.

Figure 6:
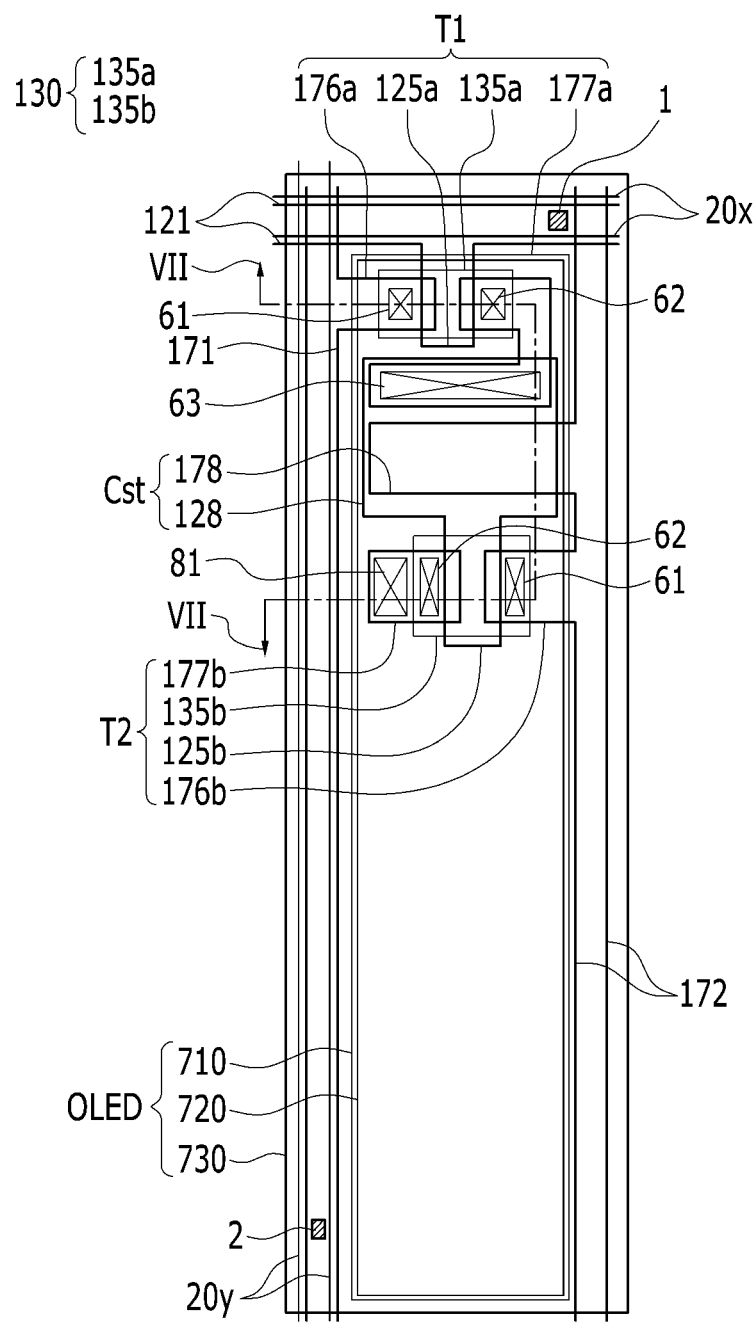
FIG. 6 is a layout view of one pixel of a first display layer of a display device according to an exemplary embodiment of the present disclosure.

FIG. 6 is a layout view of one pixel of a first display layer of a display device according to an exemplary embodiment of the present disclosure. FIG. 7 is a cross-sectional view taken along line VII-VII of FIG. 6.

Figure 7:
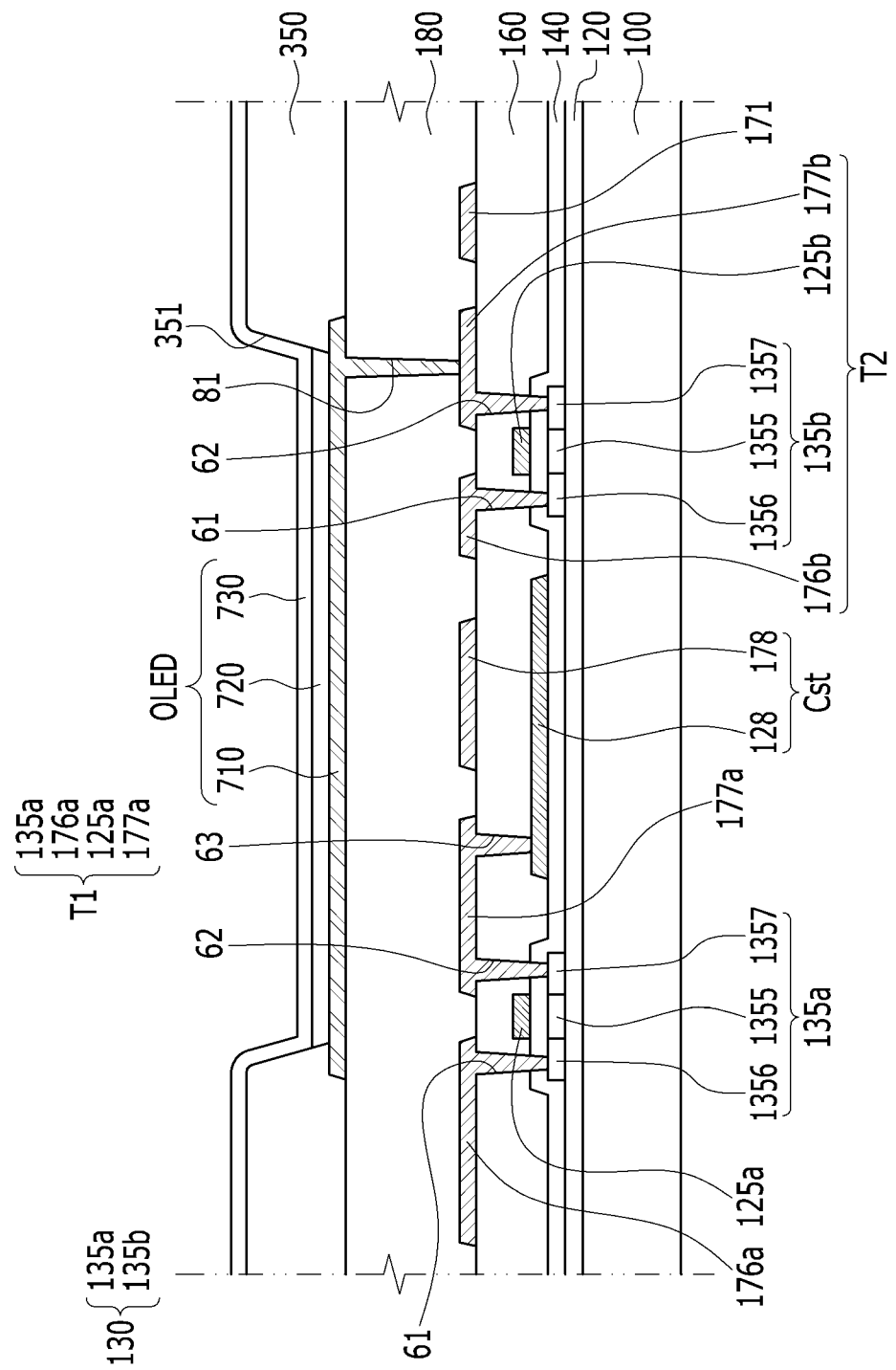
FIG. 7 is a cross-sectional view taken along line VII-VII of FIG. 6.

As shown in FIGS. 6 and 7, the first display layer 200 includes a buffer layer 120 positioned on the substrate 100. The buffer layer 120 can be formed of a single layer of a silicon nitride (SiNx), or a dual-layer structure in which a silicon nitride (SiNx) and a silicon oxide (SiOx) are deposited. The buffer layer 120 serves to planarize the surface of the first display layer 200 while preventing unnecessary components such as an impurity or moisture from permeating therethrough.

A semiconductor 130 is formed on the buffer layer 120. The semiconductor 130 includes a switching semiconductor 135a and a driving semiconductor 135b that are separated from each other. The semiconductors 135a and 135b can be formed of a polycrystalline semiconductor material or an oxide semiconductor material. The oxide semiconductor material can include any oxide based on titanium (Ti), hafnium (Hf), zirconium (Zr), aluminum (Al), tantalum (Ta), germanium (Ge), zinc (Zn), gallium (Ga), tin (Sn), or indium (In), and indium-gallium-zinc oxide (InGaZnO4), indium-zinc oxide (Zn—In—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), or hafnium-indium-zinc oxide (Hf—In—Zn—O) which are compound oxides thereof. When the semiconductor layer 130 is formed of an oxide semiconductor, a separate passivation layer can be added in order to protect the oxide semiconductor, which is vulnerable to certain environmental conditions, such as high temperature.

The switching semiconductor 135a and the driving semiconductor 135b are respectively divided into a channel 1355 and a source region 1356 and drain region 1357 respectively formed at both sides of the channel 1355. The channels 1355 of each of the switching semiconductor 135a and the driving semiconductor 135b are channel-doped with a doping impurity of an N-type impurity or a P-type impurity. The source regions 1356 and the drain regions 1357 of the switching semiconductor 135a and the driving semiconductor 135b are contact doping regions that are contact-doped with a higher doping concentration of the doping impurity than the channel doping.

A gate insulating layer 140 is formed on the switching semiconductor 135a and the driving semiconductor 135b. The gate insulating layer 140 can be formed of a single layer or a multilayer including at least one of a silicon nitride and a silicon oxide.

A scan line 121, a driving gate electrode 125b, and a first storage capacitor plate 128 are formed on the gate insulating layer 140. The scan line 121 extends in the horizontal direction and transmits the scan signal Sn, and includes a switching gate electrode 125a extending from the scan line 121 to the switching semiconductor 135a. The driving gate electrode 125b protrudes from the first storage capacitor plate 128 to the driving semiconductor 135b. The switching gate electrode 125a and the driving gate electrode 125b respectively overlap the channels 1355 of the switching semiconductor 135a and the driving semiconductor 135b.

An interlayer insulating layer 160 is formed on the scan line 121, the driving gate electrode 125b, and the first storage capacitor plate 128. The interlayer insulating layer 160 can be formed of a silicon nitride or a silicon oxide like the gate insulating layer 140.

The interlayer insulating layer 160 and the gate insulating layer 140 have a source contact hole 61 and a drain contact hole 62 respectively overlapping the source region 1356 and the drain region 1357, and a storage contact hole 63 overlapping a part of the first storage capacitor plate 128.

A data line 171 having a switching source electrode 176a, a driving voltage line 172 having a driving source electrode 176b and a second storage capacitor plate 178, a switching drain electrode 177a connected to the first storage capacitor plate 128, and a driving drain electrode 177b are formed on the interlayer insulating layer 160.

The data line 171 transmits a data signal Dm and extends in the direction crossing the gate line 121. The driving voltage line 172 transmits the driving voltage ELVDD, is separated from the data line 171, and extends in substantially the same direction.

The switching source electrode 176a protrudes from the data line 171 toward the switching semiconductor 135a, and the driving source electrode 176b protrudes from the driving voltage line 172 to the driving semiconductor 135b. The switching source electrode 176a and the driving source electrode 176b are respectively connected to the source regions 1356 of the switching semiconductor 135a and the driving semiconductor 135b through the source contact holes 61.

The switching drain electrode 177a faces the switching source electrode 176a, the driving drain electrode 177b faces the driving source electrode 176b, and the switching drain electrode 177a and the driving drain electrode 177b are respectively connected to the drain regions 1357 of the switching semiconductor 135a and the driving semiconductor 135b through the drain contact hole 62.

The source contact hole 61 overlapping the source region 1356 and the drain contact hole 62 overlapping the drain region 1357 are defined in both the gate insulating layer 140 and the interlayer insulating layer 160.

The switching drain electrode 177a extends and is electrically connected to the first storage capacitor plate 128 and the driving gate electrode 125b through the storage contact hole 63 defined in the interlayer insulating layer 160.

The second storage capacitor plate 178 protrudes from the driving voltage line 172 and overlaps the first storage capacitor plate 128. Accordingly, the first storage capacitor plate 128 and the second storage capacitor plate 178 form the storage capacitor Cst using the interlayer insulating layer 160 as a dielectric material.

The switching semiconductor 135a, the switching gate electrode 125a, the switching source electrode 176a, and the switching drain electrode 177a form the switching transistor T1, and the driving semiconductor 135b, the driving gate electrode 125a, the driving source electrode 176b, and the driving drain electrode 177b form the driving transistor T2.

A passivation layer 180 is formed on the switching source electrode 176a, the driving source electrode 176b, the switching drain electrode 177a, and the driving drain electrode 177b.

A pixel electrode 710 is formed on the passivation layer 180, and the pixel electrode 710 can be formed of a transparent conductive material such as indium tin oxide (ITO), indium zinc oxide (IZO), zinc oxide (ZnO), or indium oxide (In2O3), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). The pixel electrode 710 is electrically connected to the driving drain electrode 177b of the driving transistor T2 through a contact hole 81 formed in the interlayer insulating layer 160 to become an anode of an OLED.

A pixel defining layer 350 is positioned on the passivation layer 180 and an edge of the pixel electrode 710. The pixel defining layer 350 has a pixel opening 351 overlapping the pixel electrode 710. The pixel definition layer 350 can include a resin such as a polyacrylate or polyimide, a silica-based inorganic material, and the like.

An organic emission layer 720 is formed in the pixel opening 351 of the pixel defining layer 350. The organic emission layer 720 is formed as a multilayer including one or more of an emission layer, a hole-injection layer (HIL), a hole-transporting layer (HTL), an electron-transporting layer (ETL), and an electron-injection layer (EIL). When the organic emission layer 720 includes all of the above layers, the hole-injection layer is positioned on the pixel electrode 710 which is an anode, and the hole-transporting layer, the emission layer, the electron-transporting layer, and the electron-injection layer can be sequentially laminated thereon.

A common electrode 730 is formed on the pixel defining layer 350 and the organic emission layer 720. The common electrode 730 can be formed of a transparent conductive material such as indium tin oxide (ITO), indium zinc oxide (IZO), zinc oxide (ZnO), or indium oxide (In2O3), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). The common electrode 730 becomes the cathode of the OLED. The pixel electrode 710, the organic emission layer 720, and the common electrode 730 form the OLED.

Here, the first upper driving wire 20x is connected to the scan line 121 of the first display layer 200 through the first connection wire 1, and the second upper driving wire 20y is connected to the data line 171 of the first display layer 200 through the second connection wire 2. In the at least one exemplary embodiment, the first upper driving wire 20x is connected to the scan line 121 of the first display layer 200 through the first connection wire 1, however it is not limited thereto, and the first upper driving wire 20x can be connected to various wires depending on the structure of the display. Also, in the at least one exemplary embodiment, the second upper driving wire 20y is connected to the data line 171 of the first display layer 200 through the second connection wire 2, however it is not limited thereto, and the second upper driving wire 20y can be connected to various wires depending on the structure of the display.

In one exemplary embodiment, the first display layer is only positioned on the upper surface of the substrate, however in another exemplary embodiment the second display layer is further positioned on the lower surface of the substrate.

Next, the display device according to another exemplary embodiment of the present disclosure will be described with reference to FIGS. 8 and 9.

Figure 8:
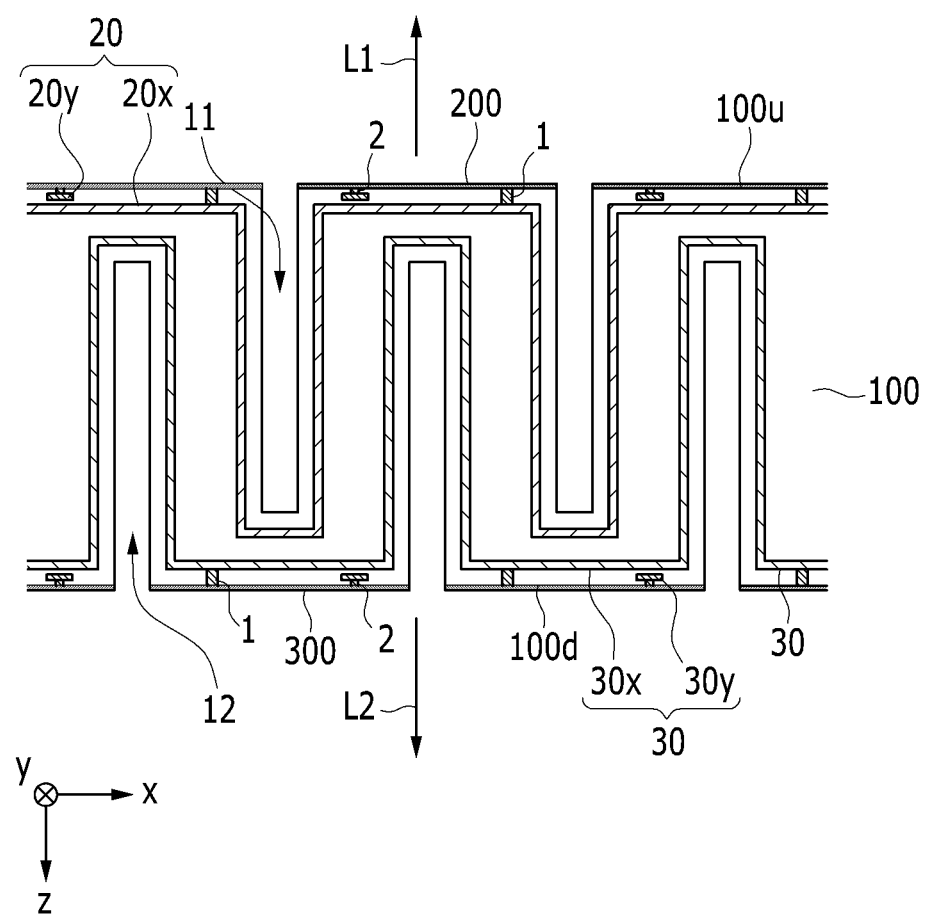
FIG. 8 is a cross-sectional view of a display device according to another exemplary embodiment of the present disclosure.

FIG. 8 is a cross-sectional view of a display device according to another exemplary embodiment of the present disclosure. FIG. 9 is a cross-sectional view showing the display device of FIG. 8 in a stretched configuration.

Figure 9:
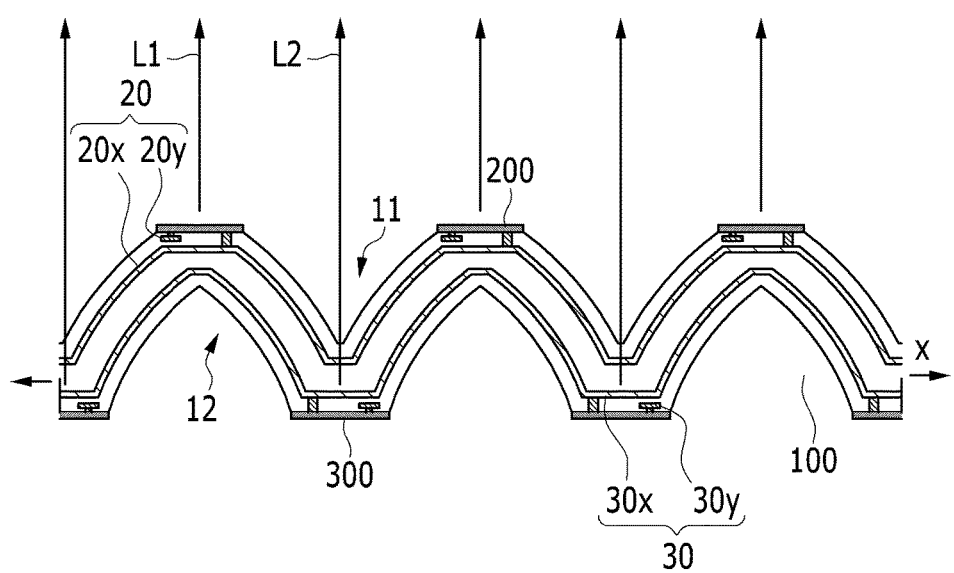
FIG. 9 is a cross-sectional view showing the display device of FIG. 8 in a stretched configuration.

The exemplary embodiment shown in FIG. 8 and FIG. 9 is substantially equivalent to the exemplary embodiment shown in FIG. 1, FIG. 2, FIG. 3, and FIG. 4, except for the second display layer, such that any redundant description is omitted.

As shown in FIG. 8, the display device includes the substrate 100, a plurality of first display layers 200 positioned on the upper surface 100u of the substrate 100, and a plurality of second display layers 300 positioned on the lower surface 100d of the substrate 100.

The substrate 100 includes a plurality of upper grooves 11 having the first opening 11a on the upper surface 100u, and a plurality of lower grooves 12 having the second opening 12a on the lower surface 100d of the substrate 100. The upper grooves 11 and the lower grooves 12 are alternately positioned or alternately arranged.

The first display layer 200 and the second display layer 300 can include a light emitting structure such as an OLED, a PLED, a QD, and an LED.

The upper driving wire 20 electrically connected to the first display layer 200 is positioned at the upper side inside the substrate 100. A lower driving wire 30 electrically connected to the second display layer 300 is positioned at the lower side inside the substrate 100. The lower driving wire 30 includes a first lower driving wire 30x extending in the first direction x, and a second lower driving wire 30y extending in the second direction y crossing the first direction x. The first lower driving wire 30x is connected to the second display layer 300 through the first connection wire 1, and the second lower driving wire 30y is connected to the second display layer 300 through the second connection wire 2.

The lower driving wire 30 is not only formed along the lower surface 100d of the substrate 100, but is also formed along the lower groove 12 of the substrate 100 such that the lower driving wire 30 is not damaged, and can be maintained as the substrate 100 is stretched.

The first display layer 200 can irradiate first light L1 in the direction of the upper surface 100u, and the second display layer 300 can irradiate second light L2 in the direction of the lower surface. Accordingly, the display device can be used as a dual-sided display.

Also, as shown in FIG. 9, when the substrate 100 is stretched, the first display layer 200 can irradiate the first light L1 in the direction of the upper surface direction, and the second display layer 300 can irradiate the second light L2 in the direction of the upper surface.

Accordingly, when the substrate 100 is stretched, the distance between the first display layers 200 is increased such that a resolution is decreased, however the second display layer 300 irradiates the second light L2 in the direction of the upper surface, thereby maintaining the resolution.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:
1. A display device, comprising:
a substrate; and
a plurality f first display layers formed on an upper surface of the substrate, wherein the substrate includes a plurality of upper grooves, each of which defines a first opening formed only in the upper surface and a plurality of lower grooves, each of which defines a second opening formed only in a lower surface of the substrate, wherein the upper grooves and the lower grooves are alternately arranged, wherein the upper grooves are positioned between the plurality first display layers, wherein the thickness of the substrate is greater than the depth of each of the upper grooves, and wherein the first display layer includes an organic emission layer.

2. The display device of claim 1, wherein:
a depth of each of the upper grooves is greater than a width of each of the upper grooves; and
a depth of each of the lower grooves is greater than a width of each of the lower grooves.

3. The display device of claim 1, wherein the substrate is configured to be stretched, wherein the width of at least one of the upper grooves is increased when the substrate is stretched, and wherein the width of at least one of the lower grooves is increased when the substrate is stretched.

4. The display device of claim 1, wherein the width of each of the upper grooves is constant when the substrate is not stretched.

5. The display device of claim 1, wherein the upper grooves include a plurality of first upper grooves extending in a first direction and a plurality of second upper grooves extending in a second direction crossing the first direction.

6. The display device of claim 5, wherein the first upper grooves and the second upper grooves are connected to each other.

7. The display device of claim 5, wherein the lower grooves include a plurality of first lower grooves extending in the first direction and a plurality of second lower grooves extending in the second direction.

8. The display device of claim 7, wherein the firs lower grooves and the second lower grooves are connected to each other.

9. The display device of claim 5, further comprising:
a plurality of upper driving wires positioned inside the substrate and extending along the upper surface and the upper grooves,
wherein the upper driving wires are electrically connected to the first display layers.

10. The display device of claim 9, wherein the upper driving wires include a plurality of first upper driving wires extending in the first direction and a plurality of second upper driving wires extending in the second direction.

11. The display device of claim 10, wherein each of the first upper driving wires includes:
a first upper transverse wire extending in the first direction along the upper surface; and
a first upper longitudinal wire extending in a depth direction of the upper grooves, and
wherein each of the second upper driving wire includes:
a second upper transverse wire extending along the upper surface in the second direction; and
a second upper longitudinal wire extending along the depth direction of the upper groove.

12. The display device of claim 5, further comprising:
a plurality of second display layers positioned on the lower surface of the substrate.

13. The display device of claim 12, further comprising:
a plurality of lower driving wires positioned inside the substrate and extending along the lower surface and the lower grooves,
wherein the lower driving wires are electrically connected to the second display layers.

14. The display device of claim 13, wherein the lower driving wires include a plurality of first lower driving wires extending in the first direction and a plurality of second lower driving wires extending in the second direction.

15. The display device of claim 14, wherein each of the first lower driving wires includes:
a first lower transverse wire extending along the lower surface in the first direction; and
a first lower longitudinal wire extending along a depth direction of the lower grooves, and
wherein each of the second lower driving wires includes:
a second lower transverse wire extending along the lower surface in the second direction; and
a second lower longitudinal wire extending along the depth direction of the lower grooves.

16. A display device. comprising:
a substrate;
a plurality of first display layers formed on an upper surface of the substrate,
wherein the substrate includes a plurality of upper grooves, each of which forms a first opening formed only in the upper surface and a plurality of lower grooves, each of which forms a second opening formed only in a lower surface of the substrate,
wherein the upper grooves and the lower grooves are alternately arranged; and
a plurality of upper driving wires extending parallel to the upper surface of the substrate and extending into the upper grooves, wherein the upper driving wires are electrically connected to the first display layers.

17. The display device of claim 16, wherein the entire upper surface of the substrate is flat.

18. The display device of claim 16, wherein:
a depth of each of the upper grooves is greater than a width of each of the upper grooves; and a depth of each of the lower grooves is greater than a width of each of the lower grooves.

19. The display device of claim 16, wherein the upper grooves include a plurality of first upper grooves extending in a first direction and a plurality of second upper grooves extending in a second direction crossing the first direction.

20. The display device of claim 19, further comprising:
a plurality of second display layers positioned on the lower surface of the substrate.

* * * * *